United States Patent [19]

Carroll

[11] Patent Number: 5,923,040
[45] Date of Patent: Jul. 13, 1999

[54] WAFER SAMPLE RETAINER FOR AN ELECTRON MICROSCOPE

[75] Inventor: Lynn J. Carroll, Middleton, Id.

[73] Assignee: Micron Technologies, Inc., Boise, Id.

[21] Appl. No.: 08/980,932

[22] Filed: Dec. 1, 1997

[51] Int. Cl.⁶ .................................................. G21K 5/08
[52] U.S. Cl. .............................. 250/440.11; 250/442.11; 250/492.2
[58] Field of Search ..................... 250/440.11, 442.11, 250/492.2; 269/238, 254 CS

[56] References Cited

U.S. PATENT DOCUMENTS 3,476,936  11/1969  Mills ..................................... 250/442.11
4,700,936  10/1987  Lunn ........................................ 269/226
4,718,651   1/1988  Brycki ....................................... 269/94
4,877,228  10/1989  Ripert ...................................... 269/156

*Primary Examiner*—Edward P. Westin
*Assistant Examiner*—Nikita Wells
*Attorney, Agent, or Firm*—Trop, Pruner, Hu & Miles, P.C.

[57] ABSTRACT

A wafer sample retainer for an electron microscope includes a clamp arranged to engage one or more wafer samples against a post. The clamp may be spring biased and may be operable by depressing a portion of a spring biased member to pivot the spring biased member away from a support post to create an opening to receive the samples. The sample holder may be removably mounted on a base which may be positioned using a conventional electron microscope positioner.

6 Claims, 1 Drawing Sheet

WAFER SAMPLE RETAINER FOR AN ELECTRON MICROSCOPE

This invention relates generally to retaining samples of semiconductor wafers for viewing by electron microscopes such as a scanning electron microscope ("SEM").

BACKGROUND OF THE INVENTION

Electron microscopes are used in semiconductor manufacturing operations to enable engineers to view the semiconductor wafers that are populated by features which are too small to visualize. Usually a sample of a disk shaped wafer is formed and an edge of that wafer or other pertinent portion is viewed under the electron microscope. The electron microscope magnifies the features of the sample and allows its configuration to be studied. Scanning electron microscopes are commonly utilized to determine whether features which are formed in the semiconductor wafer correspond to what was designed, intended or most desirable.

Traditionally, the samples are secured to an adjustably positionable base in the electron microscope. The base may be connected to a sample holder which actually retains the semiconductor wafer samples. These samples are secured to an upstanding member on the sample holder using copper tape and curable adhesive. Commonly, the curable adhesive must be allowed to dry for several hours before the sample can be studied in the electron microscope. Thus, existing techniques require considerable effort to secure the sample for viewing. Perhaps more importantly, the procedure takes an excessive amount of time, thereby delaying the feedback to the design engineers.

Therefore, it would be desirable to provide a technique for readily securing the wafer samples in the hostile environment inside an electron microscope.

SUMMARY OF THE INVENTION

In accordance with one aspect of the present invention, a wafer sample retainer for an electron microscope includes a base and a sample holder removably connectable to the base. A spring biased member is arranged to contact a wafer sample and to secure the sample against the sample holder.

In accordance with another aspect of the present invention, a wafer sample retainer for an electron microscope includes a rail, a base adjustably positionable along the rail, and a sample holder. The sample holder is removably connectable to the base. The sample holder includes an upstanding post. A spring biased member is mounted for pivotal rotation on the holder. The member has a free end pivotable towards and away from the post.

In accordance with still another aspect of the present invention, a method of retaining a wafer sample for examination under an electron microscope includes the step of securing a sample retainer to a base. A spring biased arm is biased against the sample to secure the sample between the arm and the retainer.

At least certain embodiments of the present invention are advantageous, among other reasons, because they simplify and expedite sample holding in electron microscopes.

DESCRIPTION OF THE PREFERRED EMBODIMENTS

Figure 1:
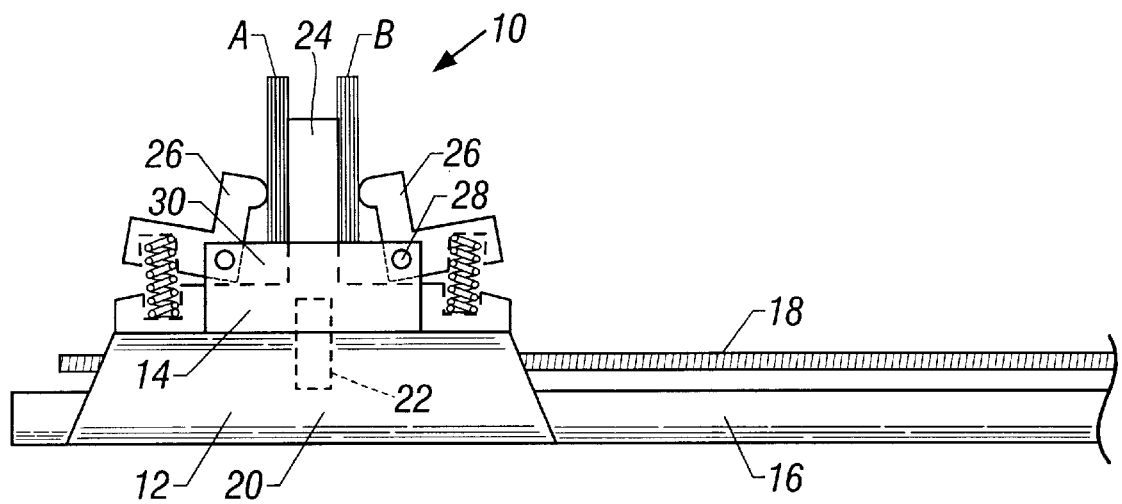
FIG. 1 is a front elevational view of one embodiment of the present invention shown holding a plurality of wafer samples.

Referring to the drawing wherein like reference characters are used for like parts throughout the several views, a wafer sample retainer 10, shown in FIG. 1, includes a base 12 and a sample holder 14. The base 12 is slidably positionable along a conventional dove-shaped rail 16 which is driven by a threaded rod 18. In this way, the position of the base 12 along the rail 16 can be adjusted to appropriately locate the samples for viewing in the electron microscope.

The base 12 includes a central opening 20 which receives a pin 22 connected to the sample holder 14. Thus, the sample holder 14 is removably securable on the base 12 in appropriate alignment therewith.

The illustrated sample holder 14 is arranged to hold two sets of samples "A" and "B". Each of the samples may be made up of one or more semiconductor wafer pieces which may be sandwiched together for conjoined viewing. In some instances, only one of the sample holders may be utilized.

Each set of samples is secured against an upstanding post 24 by a spring biased pivotal member 26. The member 26 is secured for pivoting about the axial pin 28 secured in a plate 30 which is part of the sample holder 14.

Figure 2:
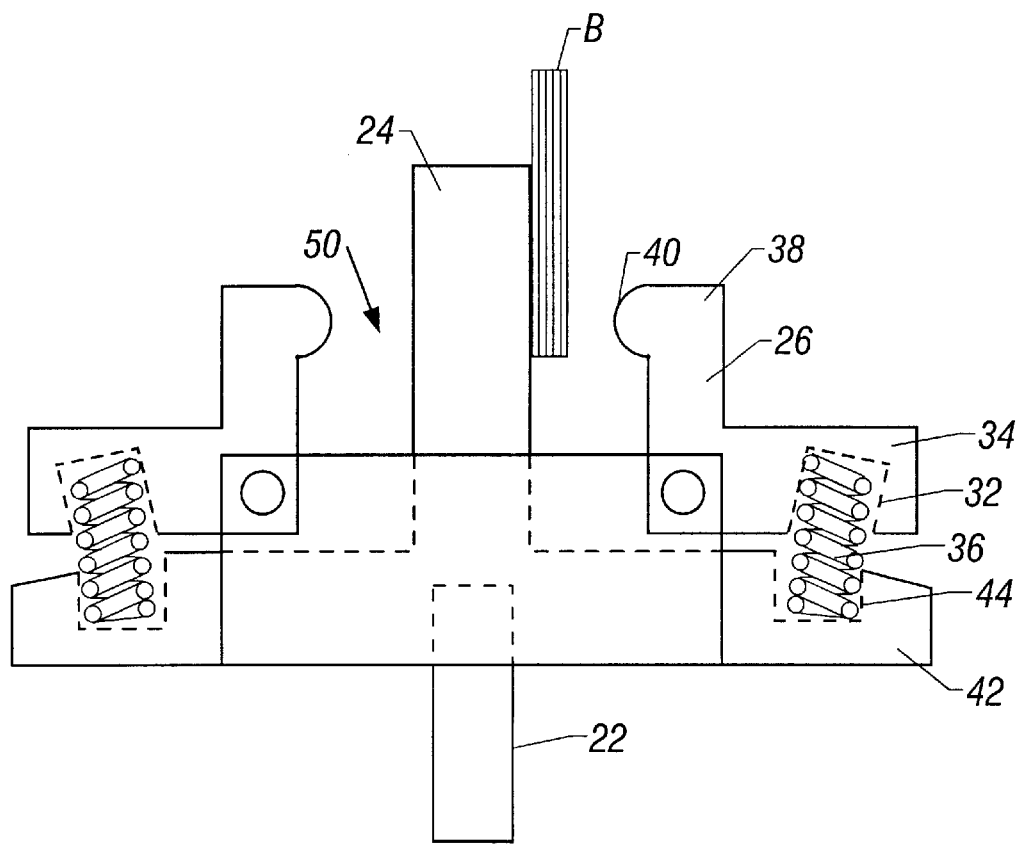
FIG. 2 is an enlarged elevational view of a portion of the embodiment shown in FIG. 1 opened to receive wafers.

Referring to FIG. 2, the member 26 may be L-shaped having a first portion 34 which includes a spring keeper 32 and a second portion 38 which includes a rounded bump 40. The bump 40 contacts the semiconductor wafers "B" and, because of its rounded configuration, avoids damaging those samples. The foot 42 of the holder 14 also includes a spring keeper 44 which maintains one end of a spring 36 while the other end is maintained in the keeper 32 in the portion 34.

The illustrated sample holder 14 is symmetrical and similar parts are contained on each side. For example, the sample retaining opening 50 could be on the order of 0.0170 of an inch which would receive 6 normal thickness semiconductor wafer samples.

The retainer 10 is operated by depressing the tops of the first portions 34, forming the sample retaining openings 50, as shown in FIG. 2. Once released, the member 26 biases the samples against the opposite side of the upstanding post 24.

While the present invention has been described with respect to a single preferred embodiment, those skilled in the art will appreciate numerous modifications and variations therefrom. For example, while the illustrated embodiment includes two spring biased members, in some instances one such member may be sufficient. It is intended that the appended claims cover all such modifications and variations as fall within the true spirit and scope of the present invention.

What is claimed is:

1. A wafer sample retainer for an electron microscope comprising:

a rail;

a base adjustably positionable along said rail;

a sample holder removably connectable to said base, said holder having an upstanding post;

an L-shaped spring biased member mounted for pivotal rotation on said holder, said member having first and second elements, said first element having a free end, said free end pivotal towards and away from said post against said spring biased member, said second element having a manually displaceable free end such that when said free end of said second element is manually displaced, said free end of said first element is displaced away from said post; and a sample retainer opening (slot) arranged between said post and said member to receive a wafer such that said wafer is spring biased against said post by said member when said member is not manually displaced and when said member is manually displaced, the spring bias of said member against said wafer is removed, allowing said wafer to be removed from said slot.

2. The retainer of claim 1 wherein said free end includes a rounded portion arranged to engage said sample.

3. The retainer of claim 1 wherein said spring biased member is adapted to secure a plurality of wafer samples to said post at one time.

4. The retainer of claim 1 wherein said spring biased member is L-shaped, having a pair of portions connected at a corner, said member being mounted for rotation about said corner, one of said portions being depressible to rotate the other of said portions towards and away from said post.

5. The retainer of claim 4 including pair of spring biased members each arranged to pivot towards and away from said post.

6. The retainer of claim 5 wherein each of said spring biased members is arranged to pivot towards and away from an opposite side of said post.

* * * * *